TELEVISION TUNER INPUT CIRCUIT FOR VHF AND UHF SIGNALS
Filed Nov. 13, 1964
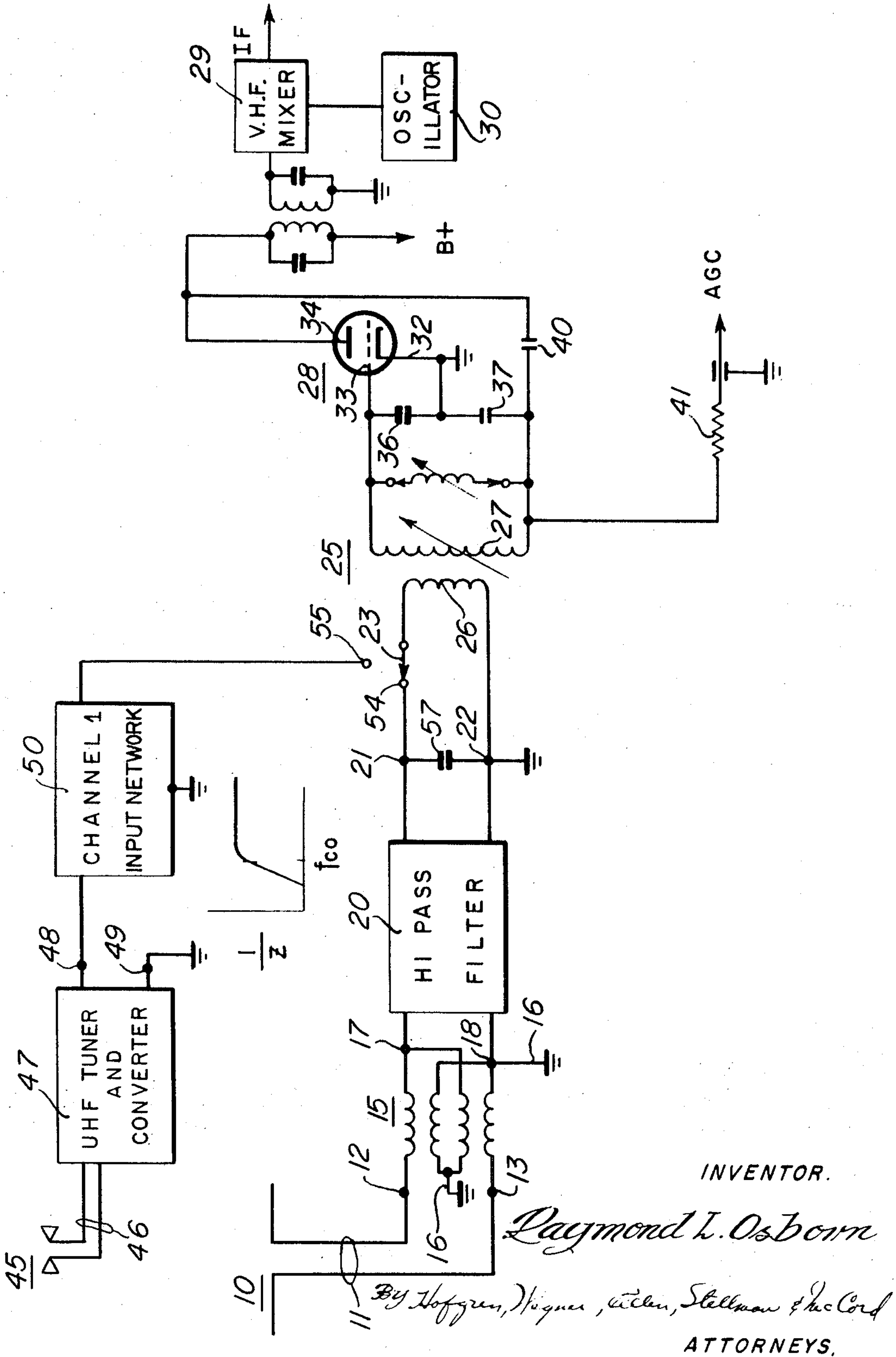
INVENTOR.
Raymond L. Osborn
By Hofgren, Wegner, Allen, Stellman & McCord
ATTORNEYS.

United States Patent Office 3,469,194
Patented Sept. 23, 1969

3,469,194

TELEVISION TUNER INPUT CIRCUIT FOR VHF AND UHF SIGNALS

Raymond L. Osborn, Skokie, Ill., assignor to Oak Electro/Netics Corporation, a corporation of Delaware Filed Nov. 13, 1964, Ser. No. 411,017
Int. Cl. H04b *1/06, 1/16*
U.S. Cl. 325—370 7 Claims

ABSTRACT OF THE DISCLOSURE

An input circuit for the RF amplifier of the VHF tuner of a television tuner which accepts the VHF signal from a 300-ohm balanced source and the UHF signal at a frequency below that of the VHF signal from a UHF converter, the UHF signal having an unbalanced 75-ohm output impedance. The primary winding of a step-up coupling transformer is selectively connected through a switch with the UHF source or with the VHF source through a high pass filter and a balun. The secondary of the transformer is connected with the input of an amplifier which serves as a radio frequency amplifier for VHF and as an intermediate frequency amplifier for UHF.

This invention is concerned with a novel input circuit for a VHF-UHF television tuner.

Television broadcasting frequencies are divided into two bands, the VHF (54 to 216 megacycles) and the UHF (470 to 890 megacycles). A representative VHF tuner includes a radio frequency amplifier, mixer stage and local oscillator with suitable resonant circuits to provide selectivity and establish the pass band of the receiver. The received VHF television signal is converted by the mixer stage to a fixed intermediate frequency in the band from 41 to 47 megacycles.

In a television receiver which is equipped to receive signals in both bands, it is common practice to utilize a UHF tuner or converter circuit in which the UHF signal is heterodyned to a frequency band of 41 to 47 megacycles, the intermediate frequency of the VHF tuner. The signal from the UHF converter is coupled to the radio frequency amplifier stage of the VHF tuner and the VHF oscillator is disabled so that the VHF mixer stage serves as an additional stage of amplification for the VHF signal.

Tuning systems in the past have required two separate and independent input networks, one for the VHF signal and the other for the output of the UHF converter. This was necessary because of the difference in impedance level and the condition of balance to ground of the two signals. The VHF signal is normally coupled to the VHF tuner through a 300 ohm transmission line which is balanced with respect to ground. The output of the UHF converter may be at 75 ohms and unbalanced with respect to ground.

It is a principal object of this invention to provide an improved input network for the VHF television tuner which will handle both the VHF signal and the converted UHF signal through substantially the same circuitry without duplication of components and with a minimum number of elements.

One feature of the invention is the provision of an input circuit in which the VHF signal coupled to the receiver over a 300-ohm balanced line is connected to a balun which converts it to a 75-ohm unbalanced signal, comparable with the output of the UHF converter. A switch in the primary winding of the input coupling transformer for the radio frequency amplifier is operable to select either the VHF or UHF signal. A network coupled between the secondary winding of the transformer and the input of the radio frequency amplifier and including the coupling transformer raises the impedance level to match the amplifier input and provides a balanced to ground signal.

Another feature of the invention is the inclusion of a high pass filter having a cutoff frequency of above the output of the UHF tuner and below the lowest frequency of the VHF signals, between the balun and the selector switch in the transformer primary.

Still another feature is that one terminal of the balun output and one terminal of the primary winding of the coupling transformer are both connected with a reference potential or ground, and the coupling network for the UHF signal is likewise referred to ground. The other terminal of the primary winding of the input transformer is connected with the movable pole of a single-pole, double-throw switch which is actuable to select either the VHF or the UHF signal.

Further features and advantages of the invention will readily be apparent from the following specification and from the drawing, which is a schematic diagram, partially in block form, of a circuit embodying the invention.

While an illustrative embodiment of the invention is shown in the drawings and will be described in detail herein, the invention is susceptible of embodiment in many different forms and it should be understood that the present disclosure is to be considered as an exemplification of the principles of the invention and is not intended to limit the invention to the embodiment illustrated. The scope of the invention will be pointed out in the appended claims.

The recent ruling by the Federal Communications Commission requiring that all new television receivers be equipped with UHF tuners has increased the need for economical circuits which will handle both VHF and UHF signals. The circuit disclosed herein is intended to supply that need. The invention will be described as it specifically relates to a combined input circuit for VHF and UHF television signals. It will be understood, however, that certain aspects of the invention are also applicable to the reception of related signals of other frequencies.

Turning now to the drawing, the VHF receiver input circuit includes a dipole antenna 10 connected through a transmission line 11 with the input terminals 12 and 13 of a balun 15. The VHF transmission line may, for example, be a pair of conductors bonded in an insulating body with a characteristic impedance of 300 ohmns. The two conductors of the transmission line are balanced with respect to the reference potential or ground 16 and the input terminals 12 and 13 of balun 15 are balanced with respect to ground, matching the transmision line.

Balun 15 has a pair of output terminals 17 and 18 and an output impedance of 75 ohms. Output terminal 18 is returned to ground 16 establishing an unbalance condition with respect to ground. A high pass filter 20 has input terminals connected with balun output terminals 17 and 18 and further has output terminals 21 and 22, with terminal 22 being connected to ground 16 maintaining the unbalanced condition. The high pass filter, as will appear, prevents passage in either direction of signals with a frequency below that of the lowest VHF signal to be received, here 54 megacycles. Both the input and the output impedance of filter 20 are 75 ohms, matching the output impedance of balun 15.

The received signal is coupled from filter 20 through switch 23 and transformer 25, which has a primary winding 26 and a secondary winding 27, with an RF amplifier 28. The output of the RF amplifier is coupled to a VHF mixer 29 where it is mixed with a signal from local oscillator 30 to establish an intermediate frequency output signal in the band 41 to 47 megacycles.

Radio frequency amplifier 28 is here shown as a triode having a cathode 32 returned to ground, a control grid 33 and an anode 34. The input impedance of the amplifier is several times the 75-ohm impedance level of the signal at the output of high pass filter 20. However, coupling transformer 25 has a turns ratio which matches the high impedance of the amplifier to the low impedance of the filter. In addition, it is desirable to return the signal to a balanced condition with respect to ground, before it is coupled to the amplifier. Accordingly, a capacitive voltage divider, comprised of capacitors 36 and 37, is connected across the secondary winding 27 of the coupling transformer and the juncture between the two capacitors is returned to ground. Additional selectively is achieved by tuning the amplifier input circuit. A parallel resonant condition is established between secondary winding 27 and capacitors 36 and 37. An inductor 38, connected in parallel with secondary winding 27 and the two capacitors, establishes the correct resonant frequency for each of the VHF television bands. Inductor 38 may, for example, be switched by the channel selector or band switch of the receiver.

RF amplifier 28 is neutralized by a capacitor 40 connected from the circuit of plate 34 to the lower terminal of transformer secondary winding 27. An automatic gain control potential is applied to the grid circuit through isolating resistor 41.

The transmitted UHF signals cover a frequency range of 470 to 890 megacycles. The signals are received by suitable UHF antenna 45 and coupled through a lead-in cable 46 with a UHF tuner or converter 47. In this unit the received wave is heterodyned with the output of a local oscillator to derive an output signal in the range or band from 41 to 47 megacycles, throughout the UHF band. The heterodyne output signal from the tuner appears at terminals 48 and 49 with terminal 49 being grounded. The output impedance of the UHF tuner is of the order of 75 ohms. The signal from the UHF tuner is coupled through a "channel 1" input network 50 which also has an output impedance of 75 ohms and is unbalanced with respect to ground. Channel 1 is the designation of the position of the VHF tuner for use in conjunction with UHF tuner 47 in receiving and amplifying the signal from a UHF station.

Single-pole, double-throw switch 23 has its movable arm connected with the ungrounded terminal of the primary winding 26 of transformer 25, and is selectively connectable with terminal 54 connected to output terminal 21 of high pass filter 20 or terminal 55 connected with the output of channel 1 in put network 50. In the channel 1 position, UHF tuner 47 is rendered operative while VHF local oscillator 30 is disabled. The input network for amplifier 28, the interstage coupling network between amplifier 28 and mixer 29 and the tuned circuits of the mixer are each adjusted to the frequency of the output of the UHF tuner 47, 41 to 47 megacycles. This provides additional amplification desirable for the UHF signal. In conjunction with the changes effected in the VHF tuner circuitry and in rendering UHF tuner operative, the establishment of channel 1 operating conditions actuates switch 23, connecting the movable arm with terminal 55. It will be recalled that the signals from the high pass filter 20 and the channel 1 input filter are at an impedance level of 75 ohms and unbalanced with respect to ground. As transformer 25 and the input network for RF amplifier 28 are designed to work from this source of impedance, either signal may be handled with equal facility.

The transfer characteristics of high pass filter 20 are such that signals of a frequency of 54 megacycles and above are passed substantially without attenuation. Signals below this frequency, passing in either direction, are strongly attenuated. The cutoff frequency for the filter should be between 47 and 54 megacycles so that there is no appreciable interference from signals in the band of the intermediate frequency of the receiver which may be received by antenna 10 and further so that signals at the intermediate frequency are not broadcast. In a specific example the cutoff frequency $f_{co}$ may be 50 megacycles.

Capacitor 57, connected across the primary winding 26 of coupling transformer 25, may be used to provide a desired selectivity characteristic for VHF signals.

I claim:

1. An input circuit for a VHF television receiver tuner with a source of VHF input signal in the frequency range of 54 to 216 megacycles from a balanced 300-ohm line and source of UHF–IF input signal in the range of 41 to 47 megacycles from a 75-ohm unbalanced line which is connected with the output of a UHF tuner, comprising: means establishing a reference potential; a balun impedance transformation circuit having a 300-ohm input impedance balanced with respect to said reference potential with input terminals connected to said source of VHF input signal and having output terminals with a 75-ohm output impedance unbalanced with respect to said reference potential; an impedance step-up transformer having primary and secondary windings; an amplifier having an input impedance several orders of magnitude greater than 75 ohms; means connecting said secondary winding with the input of said amplifier; and circuit means connected with the primary winding of said transformer and including a single pole, double throw switch selectively connecting said primary winding with one of the output terminals of said balun or with said source of UHF–IF input signal.

2. The television tuner input circuit of claim 1 in which a high pass filter network having a lower cut-off frequency between 47 and 54 megacycles is connected between said balun and said switch means.

3. An input circuit for a television receiver tuner with a source of VHF input signal in the frequency range of 54 to 216 megacycles from a balanced 300-ohm line and source of UHF–IF input signal in the range of 41 to 47 megacycles from a 75-ohm line unbalanced with respect to ground connected with the output of a UHF tuner, comprising: means establishing a ground reference potential; a balun impedance transformation circuit having a 300-ohm balanced input impedance with a pair of input terminals connected to said source of VHF input signal and having a pair of output terminals with a 75-ohm unbalanced output impedance, one of said output terminals being connected to ground; an impedance step-up transformer having primary and secondary windings; an amplifier having an input impedance several orders of magnitude greater than 75 ohms; means balanced with respect to ground connecting said secondary winding with the input of said amplifier; and circuit means connected with the primary winding of said transformer connecting one terminal thereof to ground and including a single pole, double throw switch selectively connecting the other terminal of said primary winding with the ungrounded output terminal of said balun or said source of UHF–IF input signal.

4. The television tuner input circuit of claim 3 wherein a high pass filter with a cut-off frequency between 47 and 54 megacycles and a characteristic impedance of the order of 75 ohms is connected between said balun and said switch, said filter circuit having one input and one output terminal connected with ground, the other input terminal connected with the other output terminal of said balun and the other output terminal connected with a fixed contact of said switch.

5. In a VHF television receiver tuner: a source of VHF input signal in the frequency range of 54 to 216 megacycles, said source having a 300-ohm balanced impedance; a source of UHF–IF input signal in a frequency range of 470 to 890 megacycles; means establishing a ground reference potential; a balun impedance transformation circuit having a 300-ohm balanced input impedance with a pair of input terminals connected to said source of VHF input signal and having a pair of output terminals with a 75-ohm unbalanced output impedance one of said output terminals being connected to ground; an impedance step-up transformer having primary and secondary windings, one of the terminals of said primary winding being connected to ground; a frequency converter connected with said source of UHF–IF input signal and having a pair of output terminals with an output impedance of 75 ohms, one of said output terminals being connected with ground; an amplifier having an input impedance several orders of magnitude greater than 75 ohms; means balanced with respect to ground connecting said secondary winding with the input of said amplifier; and a single-pole double-throw switch selectively connecting the other terminal of said primary winding with one of the other output terminals of said balun or said frequency converter.

6. An input circuit for a VHF television receiver tuner with a source of VHF input signal in a first frequency range from a balanced line at a first impedance and with a source of UHF–IF input signal in a second frequency range from an unbalanced line at a second impedance level, comprising: means establishing a reference potential; a balun impedance transformation circuit having an input impedance substantially equal to said first impedance with input terminals connected to the source of VHF input signals and having output terminals with an output impedance substantially equal to said second impedance, one of said output terminals being connected to said reference potential; an amplifier; an impedance step-up transformer having an input impedance several orders of magnitude greater than said second impedance, the amplifier being connected with the secondary winding of said transformer; and circuit means connected with the primary winding of said transformer and including a single pole, double throw switch selectively connecting said primary winding with only one of either the output terminal of said balun or said source of UHF–IF input signal.

7. An input circuit for a VHF television receiver tuner with a source of VHF input signal in the frequency range of 54 to 216 megacycles from a balanced 300 ohm line and source of UHF–IF input signal in the range of 41 to 47 megacycles from a 75-ohm line unbalanced with respect to ground connected with the output of a UHF tuner, comprising: means establishing a ground reference potential; a balun impedance transformation circuit having a 300-ohm balanced input impedance with a pair of input terminals connected with said source of VHF input signal and having a pair of output terminals with a 75-ohm unbalanced output impedance, one of said output terminals being connected to ground; an impedance step-up transformer having primary and secondary windings; an amplifier having an input impedance several orders of magnitude greater than 75-ohms; means balanced with respect to ground connecting said secondary winding with the input of said amplifier; and circuit means connected with the primary winding of said transformer connecting one terminal thereof to ground and including a single-pole, double-throw switch selectively connecting the other terminal of said primary winding with one of the ungrounded output terminal of said balun or said source of UHF–IF input signal.

References Cited

UNITED STATES PATENTS

| | | | |
|---|---|---|---|
| 3,036,212 | 5/1962 | Meyer et al. | 325—461 XR |
| 3,054,058 | 9/1962 | Towler | 325—461 XR |
| 3,242,433 | 3/1966 | Carlson et al. | 325—461 |

KATHLEEN H. CLAFFY, Primary Examiner

R. S. BELL, Assistant Examiner

U.S. Cl. X.R.

325—373, 461